United States Patent
Ozawa

(10) Patent No.: US 9,513,564 B2
(45) Date of Patent: Dec. 6, 2016

(54) EXPOSURE METHOD, EXPOSURE APPARATUS, AND DEVICE MANUFACTURING METHOD

(71) Applicant: CANON KABUSHIKI KAISHA, Tokyo (JP)

(72) Inventor: Kazuyoshi Ozawa, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 221 days.

(21) Appl. No.: 14/160,694

(22) Filed: Jan. 22, 2014

(65) Prior Publication Data
US 2014/0204353 A1 Jul. 24, 2014

(30) Foreign Application Priority Data
Jan. 24, 2013 (JP) .................................. 2013-011074

(51) Int. Cl.
G03B 27/68 (2006.01)
G03F 7/20 (2006.01)

(52) U.S. Cl.
CPC ............. *G03F 7/705* (2013.01); *G03F 7/706* (2013.01); *G03F 7/70883* (2013.01)

(58) Field of Classification Search
CPC .. G03F 7/70483; G03F 7/70491; G03F 7/705; G03F 7/70525; G03F 7/70533; G03F 7/70591; G03F 7/706; G03F 7/70883; G03F 7/70891
USPC ... 355/30, 52, 53, 55, 67–71, 77; 250/492.1, 250/492.2, 492.22, 548
See application file for complete search history.

(56) References Cited

U.S. PATENT DOCUMENTS

| 4,801,977 A | 1/1989 | Ishizaka et al. |
| 8,098,927 B2 | 1/2012 | Sukegawa |
| 8,428,763 B2 | 4/2013 | Kanda |
| 2002/0159048 A1* | 10/2002 | Inoue et al. ............ G03F 7/706 356/121 |
| 2004/0090606 A1* | 5/2004 | Ishikawa ................. G03F 7/706 355/53 |
| 2006/0114437 A1* | 6/2006 | Akhssay et al. .... G03F 7/70258 355/55 |

(Continued)

FOREIGN PATENT DOCUMENTS

| JP | 63-58349 A | 3/1988 |
| JP | 6-45217 A | 2/1994 |

(Continued)

*Primary Examiner* — Christina Riddle
(74) *Attorney, Agent, or Firm* — Rossi, Kimms & McDowell LLP

(57) ABSTRACT

Provided is an exposure method that includes setting a first exposure condition so as to calculate a coefficient for predicting the fluctuation in the imaging characteristics of the projection optical system under a certain exposure condition; determining the coefficient and a permissible value calculated from aberration measurement reproducibility based on a fluctuation characteristic model; calculating a predicted amount of the fluctuation in the imaging characteristics under the first exposure condition based on the coefficient; determining whether or not the predicted amount is less than the permissible value for each time instant; and starting calculation of the predicted amount of the fluctuation in the imaging characteristics under a second exposure condition at the time at which it is determined by the determining that the predicted amount is less than the permissible value.

12 Claims, 3 Drawing Sheets

(56) References Cited

U.S. PATENT DOCUMENTS

2009/0028421 A1* 1/2009 Sukegawa ........... G03F 7/70425
382/144

FOREIGN PATENT DOCUMENTS

| JP | 2006-073584 A | 3/2006 |
| JP | 2009-032875 A | 2/2009 |
| JP | 2011-061163 A | 3/2011 |

* cited by examiner

EXPOSURE METHOD, EXPOSURE APPARATUS, AND DEVICE MANUFACTURING METHOD

BACKGROUND OF THE INVENTION

1. Field of the Invention

The present invention relates to an exposure method and an exposure apparatus, and a device manufacturing method.

2. Description of the Related Art

An exposure apparatus is an apparatus that transfers a pattern of an original (reticle or the like) onto a photosensitive substrate (e.g., wafer or the like where the surface thereof is coated with a resist layer) via a projection optical system in a lithography step included in manufacturing steps for a semiconductor device, a liquid crystal display device, and the like. One of the important optical characteristics of such an exposure apparatus is alignment accuracy with which the patterns in a plurality of steps are overlaid accurately. An important factor that influences the alignment accuracy includes a magnification error of the projection optical system. The required pattern size shrinks every year, and accordingly a requirement for an improvement in alignment accuracy also increases. Hence, it is very important to maintain the magnification of the projection optical system at a predetermined value. Here, it is known that, when the projection optical system absorbs a part of the exposure energy, a heat generated by the absorption changes the temperature of the projection optical system, resulting in change in the optical characteristics such as the refractive index of the projection optical system, that is, resulting in occurrence of so-called thermal aberration (exposure aberration). In particular, when the projection optical system is irradiated with exposure light over a long period of time, the imaging characteristics (e.g., focus, magnification, distortion aberration, astigmatism aberration, and wavefront aberration) of the projection optical system fluctuate. Consequently, non-negligible measurement errors may undesirably occur during alignment measurement.

In view of this, Japanese Patent Laid-Open No. S63-58349 discloses a projection optical apparatus that calculates the fluctuation amount of the imaging characteristics depending on the exposure energy irradiation state of the projection optical system using a model expression including the exposure amount, exposure time, non-exposure time, and the like as parameters to thereby correct the fluctuation in imaging characteristics of the projection optical system based on the calculation result. Here, the model expression has coefficients for the respective imaging characteristics specific to the projection optical system. The fluctuation in the imaging characteristics of the projection optical system can be calculated by setting the coefficients appropriately. In addition, Japanese Patent Laid-Open No. 2009-32875 discloses a method in which exposure under the second exposure condition is continuously performed prior to complete settlement of aberration fluctuation generated under the first exposure condition, and aberration fluctuation coefficients for predicting aberration fluctuation under the respective exposure conditions are determined so as to efficiently predict the fluctuation in the imaging characteristics for each exposure condition.

However, in the method disclosed in Japanese Patent Laid-Open No. S63-58349, when a coefficient is independently calculated for each exposure condition, the projection optical apparatus needs to be left to stand (cooled) until the aberration fluctuation generated under the first exposure condition almost disappears in order to increase determination accuracy. Thus, when many exposure conditions need to be taken into consideration, much time is required until aberration fluctuation is settled due to the characteristics of the thermal relaxation phenomenon. While, in the method disclosed in Japanese Patent Laid-Open No. 2009-32875, exposure under the second exposure condition starts prior to complete settlement of aberration fluctuation generated under the first exposure condition, the start of exposure under the second exposure condition is determined based on whether or not the preset required time has elapsed or whether or not a preset required number of measurement points has been acquired. In other words, in the method, after elapse of the required time, exposure under the second exposure condition forcibly starts regardless of the measurement state under the first exposure condition. Thus, if an error is generated in the aberration fluctuation coefficient under the first exposure condition due to factors such as a measurement error and the like, the first exposure condition shifts to the second exposure condition with the error included therein. Consequently, it becomes difficult to determine the aberration fluctuation coefficient under the second exposure condition with high accuracy.

SUMMARY OF THE INVENTION

The present invention provides an exposure method that is advantageous for predicting the fluctuation in the imaging characteristics for each exposure condition in a short time with high accuracy.

According to an aspect of the present invention, an exposure method for exposing a pattern formed on an original onto a substrate via a projection optical system is provided that includes setting a first exposure condition so as to calculate a coefficient for predicting the fluctuation in the imaging characteristics of the projection optical system under a certain exposure condition; determining the coefficient and a permissible value calculated from aberration measurement reproducibility based on a fluctuation characteristic model that includes an exposure model indicating aberration fluctuation during irradiation of the projection optical system with exposure light, and a non-exposure model indicating aberration fluctuation in a state in which irradiation is stopped; calculating the predicted amount of the fluctuation, in the imaging characteristics under the first exposure condition based on the coefficient; determining whether or not the predicted amount is less than the permissible value for each time instant; and starting calculation of the predicted amount of the fluctuation in the imaging characteristics under a second exposure condition at the time at which it is determined by the determining that the predicted amount is less than the permissible value.

Further features of the present invention will become apparent from the following description of exemplary embodiments with reference to the attached drawings.

DESCRIPTION OF THE EMBODIMENTS

Hereinafter, preferred embodiments of the present invention will now be described with reference to the accompanying drawings.

Figure 1:
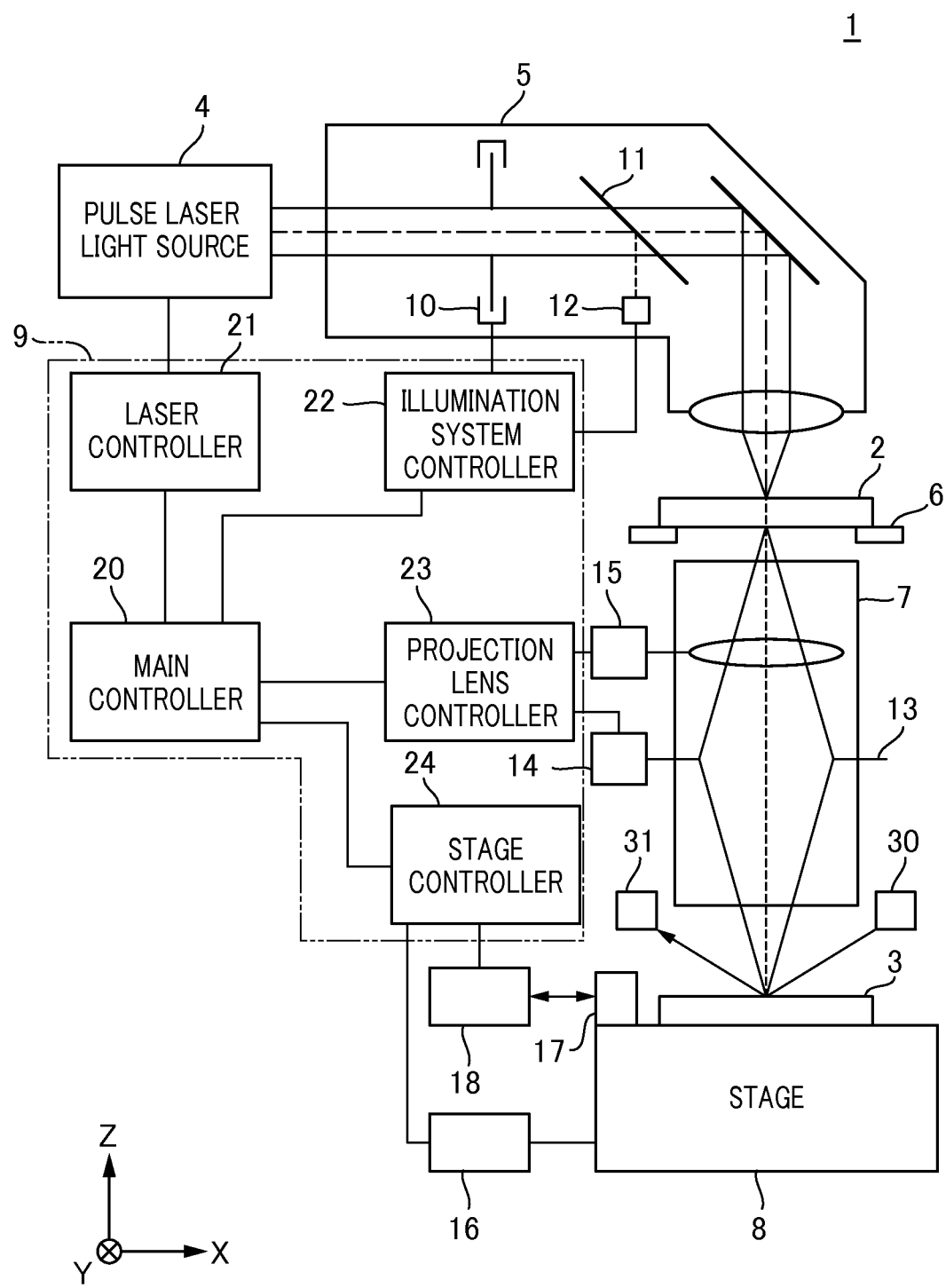
FIG. 1 is a diagram illustrating a configuration of an exposure apparatus according to one embodiment of the present invention.

Firstly, a description will be given of the configuration of an exposure apparatus according to one embodiment of the present invention. FIG. 1 is a schematic view illustrating the configuration of an exposure apparatus 1 of the present embodiment. As an example, the exposure apparatus 1 is a projection type exposure apparatus that is used for the manufacturing process of a semiconductor device and exposes a pattern (e.g., circuit pattern) formed on a reticle (original) 2 to a wafer 3 (substrate) in a step-and-repeat system. Firstly, the exposure apparatus 1 includes a pulse laser light source 4, an illumination system 5, a reticle stage 6, a projection optical system 7, a stage 8, and a controller 9.

The pulse laser light source 4 in which a gas such as KrF, ArF, or the like is sealed emits light (laser) having a wavelength in a far ultraviolet region of, for example, 248 nm. The illumination system 5 includes a beam shaping optical system and an optical integrator (none of which is shown) and an aperture 10. The beam shaping optical system shapes a beam emitted from the pulse laser light source 4 into a predetermined beam shape. The optical integrator forms a large number of secondary light sources such that the shaped beam illuminates the reticle 2 with a uniform illuminance distribution. The opening of the aperture 10 is almost circular and variable. A half mirror 11 is positioned on the optical path of the illumination system 5 and reflects and extracts a part of the exposure light that illuminates the reticle 2. Furthermore, an ultraviolet light photosensor 12 is positioned on the optical path of the reflected light of the half mirror 11 and generates an output corresponding to the intensify (exposure energy) of the exposure light. The reticle stage (original holder) 6 is movable in the three-dimensional direction while placing and holding the reticle 2 thereon. The projection optical system 7 reduces the pattern image formed on the reticle 2 with a reduction magnification β (e.g., ¼) and forms an image by projection on one shot (pattern transfer area) on the wafer 3 serving as a photosensitive substrate coated with a photoresist. An aperture 13 having an almost circular opening is positioned on the pupil plane (a Fourier transformation plane for the reticle 2) of the projection optical system 7. A driving unit 14 such as a motor controls the diameter of the opening of the aperture 13. A field lens driving unit 15 is positioned on the upstream side of the pupil plane of the projection optical system 7. The field lens driving unit 15 serves to move a field lens that constitutes a part of the lens system in the projection optical system 7 along the optical axis of the projection optical system 7 by utilising a pneumatic pressure, a piezoelectric element, or the like, resulting in prevention of degradation in various aberrations generated in the projection optical system 7. The stage (substrate holder, wafer stage) 8 is movable in the three-dimensional direction while placing and holding the wafer 3 thereon, and can move in the direction of the optical axis (Z-axis direction) of the projection optical system 7 and within a plane (X-Y plane) perpendicular to the direction of the optical axis by a driving unit 16 such as a motor. A laser interferometer 18 measures the distance to a moving mirror 17 fixed to the stage 8, thereby detecting the position of the stage 8 on the X-Y plane.

The controller 9 includes a main controller 20, a laser controller 21, an illumination system controller 22, a projection lens controller 23, and a stage controller 24. The main controller 20 is connected to the controllers (control circuits) for the components of the exposure apparatus 1 via a line so as to be integrally control the components. The laser controller 21 controls the operation of the pulse laser light source 4. More specifically, the laser controller 21 executes control for a gas exchange operation, control for wavelength stabilization, control for a discharge applied voltage, and the like. The illumination system controller 22 controls the diameter of the opening of the aperture 10 to be a desired diameter so that the numerical aperture (NA) of the illumination system 5 can be set to a desired value. Furthermore, the illumination system controller 22 transmits the output of the photosensor 12 to the main controller 20. The projection lens controller 23 controls the operation performed by the driving unit 14 used for the aperture 13 and the field lens driving unit 15. The stage controller 24 detects the position of the stage 8 based on the output of the laser interferometer 18 and controls the driving unit 16 based on the position to move the stage 8 to a predetermined position on the X-Y plane.

The exposure apparatus 1 further includes a focus plane detection unit that is constituted by a floodlight optical system 30 and a detection optical system 31. The floodlight optical system 30 projects a plurality of light beams consisting of non-exposure light that does not photosensitize the resist on the wafer 3. The projected light beams are focused on the wafer 3 and reflected. The detection optical system 31 has a plurality of position detecting light-receiving elements which are disposed therein and correspond to the respective light beams reflected by the wafer 3. The reflected light beams are incident on the detection optical system 31. The light-receiving surfaces of the respective light-receiving elements and the reflection points for the respective light beams on the wafer 3 are almost conjugate through an imaging optical system. Thus, a positional shift on the surface of the wafer 3 in the direction of the optical axis of the projection optical system 7 is measured as a positional shift of the incident light beams on the light-receiving elements in the detection optical system 31.

With the aforementioned configuration, the exposure apparatus 1 exposes a pattern to the wafer 3. When the projection optical system 7 absorbs a part of the exposure energy during exposure, a heat generated by the absorption may change the optical characteristics such as the refractive index of the projection optical system 7, resulting in occurrence of so-called thermal aberration (exposure aberration). In particular, when the projection optical system 7 is irradiated with exposure light over a long period of time, the imaging characteristics of the projection optical system 7 fluctuate. Consequently, non-negligible measurement errors may undesirably occur during alignment measurement, for example. Here, the term "imaging characteristics" refers to at least one of focus, magnification, distortion, astigmatism aberration, spherical aberration, coma aberration, and wavefront aberration. These aberrations may change depending on their exposure conditions during exposure. Here, the term "exposure condition" refers to the shape of a valid light source, the shape of a pattern formed on the reticle 2, an exposure area, or the like. Accordingly, in the present embodiment, aberration fluctuation (the fluctuation in the imaging characteristics) is efficiently predicted as follows depending on change for each exposure condition, so that the influence of aberration fluctuation on the projection optical system 7 is particularly suppressed.

Figure 2:
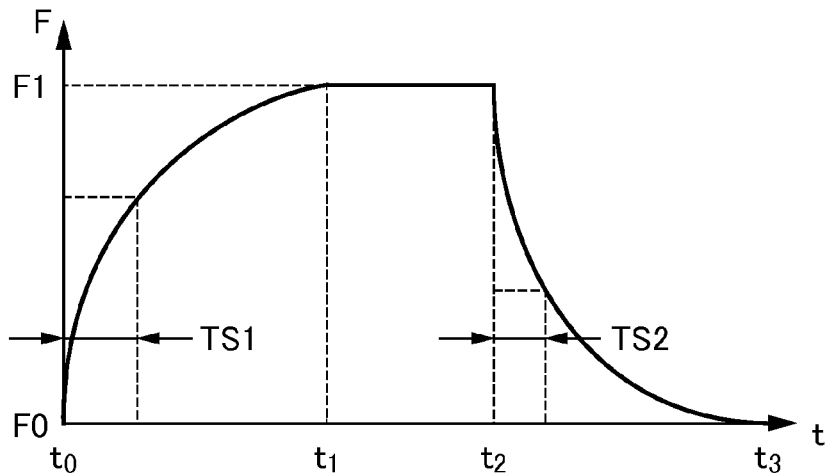
FIG. 2 is a graph illustrating an example of the aberration fluctuation of a projection optical system.

Firstly, a description will be given of the model expression of the aberration fluctuation of the projection optical system 7 that occurs upon irradiation with the exposure energy according to the present embodiment and an aberration fluctuation coefficient (coefficient) for compensating aberration fluctuation for each exposure condition by quantifying the model expression. FIG. 2 is a graph illustrating an example of a change over time of the aberration of the projection optical system 7 caused by exposure. Here, a time t is plotted on the horizontal axis and an aberration amount F of a certain image height of the projection optical system 7 is plotted on the vertical axis. Also, F1-F0 indicates the fluctuation amount of aberration and generally takes a different value for each image height. Assume that the initial value of the aberration amount as the imaging characteristics value of the projection optical system 7 is an initial aberration amount F0. When the pulse laser light source 4 starts exposure of the projection optical system 7 at time t0, the aberration fluctuates as the time passes, and stabilizes at a constant maximum aberration amount F1 at time t1. After that, even when the pulse laser light source 4 continuously irradiates the projection optical system 7 with the exposure light, the energy absorbed by the projection optical system 7 to generate heat and the thermal energy emitted by the projection optical system 7 reach an equilibrium, so that the aberration amount does not change from the maximum aberration amount F1. When exposure is stopped at time t2, the aberration amount is restored to the initial state as time passes, and reaches the initial aberration amount F0 at time t3. Furthermore, time constants TS1 and TS2 shown in FIG. 2 are equivalent to the time constants on the heat transfer characteristics of the projection optical system 7. The time constants TS1 and TS2 are values unique to each projection optical system 7 and change from one aberration to another. Hence, the time constants TS1 and TS2 are acquired for each apparatus and for each aberration upon inspection of the projection optical system 7.

The maximum aberration amount F1 shown in FIG. 2 is expressed by Formula (1) using an aberration fluctuation amount K per unit light amount (unit exposure energy) and a parameter Q of the exposure condition (the exposure time, exposure amount, scanning speed, exposure area information, and the like) which determines the actual exposure energy:

$$F1 = K \times Q \qquad (1)$$

Here, assuming that the aberration amount at a given time t is $\Delta F(t)$, an aberration amount $\Delta F(t+\Delta t)$ obtained by exposure for a time $\Delta t$ from the given time, the aberration amount $\Delta F(t+\Delta t)$ is approximated by the following Formula (2):

$$\Delta F(t+\Delta t) = \Delta F(t) + F1 \times (1 - \exp(-\Delta t/TS1)) \qquad (2)$$

from the maximum fluctuation amount F1 and the time constants TS1 and TS2 stored for each aberration.

Likewise, if exposure is not performed for the time $\Delta t$, the aberration amount $\Delta F(t+\Delta t)$ is approximated by the following Formula (3):

$$\Delta F(t+\Delta t) = \Delta F(t) \times \exp(-\Delta t/TS2) \qquad (3)$$

The curve shown in FIG. 2 is modeled using the functions of the above Formulae (1), (2), and (3), so that the fluctuation in the aberration, caused by the exposure heat, of the projection optical system 7 can be predicted. In this example, the obtained fluctuation characteristic model includes an exposure model indicating aberration fluctuation during irradiation of the projection optical system 7 with the exposure light and a non-exposure model indicating aberration fluctuation in a state in which irradiation is stopped. The exposure model is expressed by Formula (2), and the non-exposure model is expressed by Formula (3). Note that Formulae (1), (2), and (3) are merely an example of this embodiment, and the curve may be modeled using other Formulae.

Figure 3:
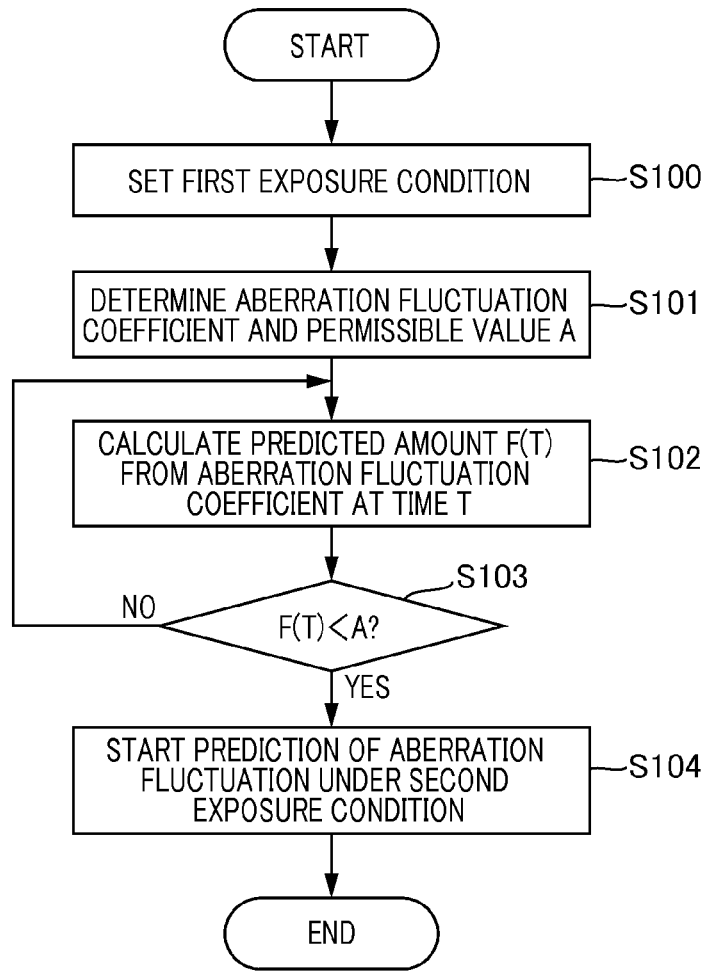
FIG. 3 is a flowchart illustrating the flow of predicting aberration fluctuation.

FIG. 3 is a flowchart illustrating the flow of predicting the aberration fluctuation of the projection optical system 7 according to the present embodiment. Firstly, the main controller 20 sets an exposure condition for calculating an aberration fluctuation coefficient as the first exposure condition (step S100). Next, the main controller 20 determines an aberration fluctuation coefficient (optimum correction model) for predicting aberration fluctuation under the first exposure condition and a permissible value A based on a fluctuation characteristic model (here, exposure model) (step S101). At this time, the main controller 20 also calculates the initial aberration amount F0 based on the first exposure condition. Next, the main controller 20 applies the aberration fluctuation coefficient obtained in step S101 to the respective approximation formulae, i.e., the exposure model and the non-exposure model to thereby calculate a predicted amount (the predicted amount of exposure aberration) F(T) from the aberration fluctuation coefficient at time T (step S102).

Figure 4:
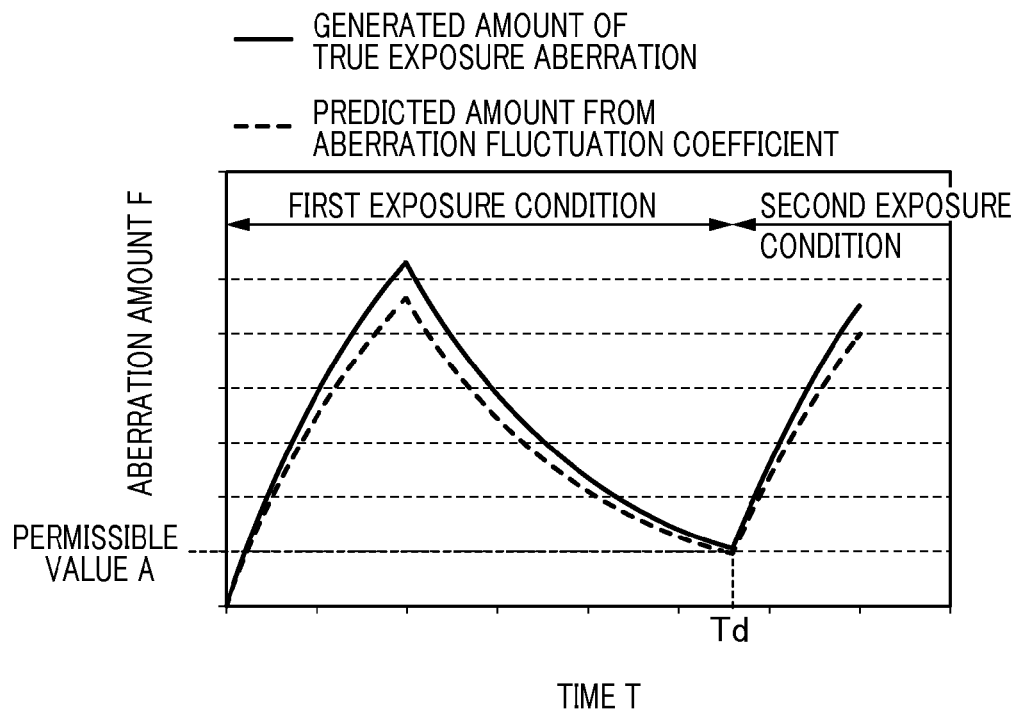
FIG. 4 is a graph illustrating the prediction of aberration fluctuation.

FIG. 4 is a graph illustrating the prediction of aberration fluctuation according to the present embodiment. As in FIG. 2, a time t is plotted on the horizontal axis and an aberration amount F of a certain image height of the projection optical system 7 is plotted on the vertical axis. The broken like shown in FIG. 4 indicates the predicted amount from the aberration fluctuation coefficient and the solid line shown in FIG. 4 indicates the generated amount of true exposure aberration. As can be seen from the comparison between the solid line and the broken line shown in FIG. 4, the predicted amount from the aberration fluctuation coefficient does not necessarily match the generated amount of true exposure aberration. The difference between the predicted amount from the aberration fluctuation coefficient and the generated amount of true exposure aberration is caused by the error of a measuring instrument during measuring aberration. Hereinafter, the aberration measurement reproducibility produced by the accuracy of a measuring instrument independent of each exposure condition is represented by "f".

On the other hand, the permissible value A is represented by Formula (4) using the aberration measurement reproducibility f and the constant C:

$$A = C \times (1/f) \qquad (4)$$

Furthermore, the permissible value A is represented by Formula (5) using the aberration measurement reproducibility f, the constant C', and the maximum aberration amount F1 under the first exposure condition:

$$A = C' \times (F1/f) \qquad (5)$$

Here, the constant C and the constant C' are predetermined for the type of aberration taken into consideration. For example, when aberration taken into consideration relates to magnification, the constants are uniquely determined by the configuration of the exposure apparatus 1 including the projection optical system 7. It should be noted that the permissible value A may be changed appropriately depending on a measurement error or a required correction accuracy of exposure aberration.

Next, the main controller 20 determines whether or not the predicted amount F(T) obtained in step S102 is less than the permissible value A (step S103). Here, if the main controller 20 determines that the predicted value F(T) is less than the permissible value A (satisfied F(T)<A) (YES in step S103), the main controller 20 starts the prediction of the aberration fluctuation under the second exposure condition (step S104). Here, time T when F(T) is equal to A is Td (see FIG. 4). Time Td changes depending on the first exposure condition, an aberration measurement error, and a correction accuracy of required exposure aberration. In FIG. 4, when the predicted amount F(T) is less than the permissible value A, the non-exposure model immediately ends and the prediction under the second exposure condition starts. On the other hand, if the main controller 20 determines in step S103 that the predicted value F(T) is greater than the permissible value A (NO in step S103), the process returns to step S102, and the main controller 20 repeats determination until time Td at which F(T)<A is satisfied is reached.

As described above, the exposure apparatus 1 does not need to be left to stand (cooled) until the aberration fluctuation generated under the first exposure condition almost disappears, so that the prediction of the aberration fluctuation under the second exposure condition can be started at an early stage, that is, the aberration fluctuation for each exposure condition can be predicted in a short time. In order to calculate the prediction of the aberration fluctuation under the second exposure condition in a short time with high accuracy subsequent to the prediction of the aberration fluctuation under the first exposure condition, it is required that the time of the non-exposure model indicating aberration fluctuation in a state in which irradiation is stopped is optimized. In contrast, the exposure apparatus 1 starts the prediction of the aberration fluctuation under the second exposure condition when the predicted value F(T) becomes less than the permissible value A. In particular, the permissible value A used in the present embodiment is calculated by taking into consideration of aberration measurement reproducibility. Thus, even if an error is generated in the aberration fluctuation coefficient under the first exposure condition due to factors such as a measurement error and the like, the circumstance that it may be difficult to determine the aberration fluctuation coefficient under the second exposure condition with high accuracy in the conventional method, which is inevitable in the conventional method, rarely occur. This means that the exposure apparatus 1 can predict the aberration fluctuation for each exposure condition with high accuracy.

As described above, according to the present embodiment, an exposure method or an exposure apparatus that is advantageous for predicting the aberration fluctuation for each exposure condition, i.e., the fluctuation in the imaging characteristics in a short time with high accuracy may be provided.

In the above description, there is a plurality of exposure conditions (first exposure condition and second exposure condition), and each of these exposure conditions is satisfied with one exposure condition (aberration (aberration amount) at this time includes all of a plurality of factors to be taken into consideration, such as an exposure time, an exposure amount, or the like). However, the present invention is not limited thereto. For example, the first exposure condition may include a plurality of independent exposure conditions and these independent exposure conditions may be evaluated simultaneously. Here, a plurality of exposure conditions is, for example, an exposure time (the 1a exposure condition) and an exposure amount (the 1b exposure condition).

Figure 5:
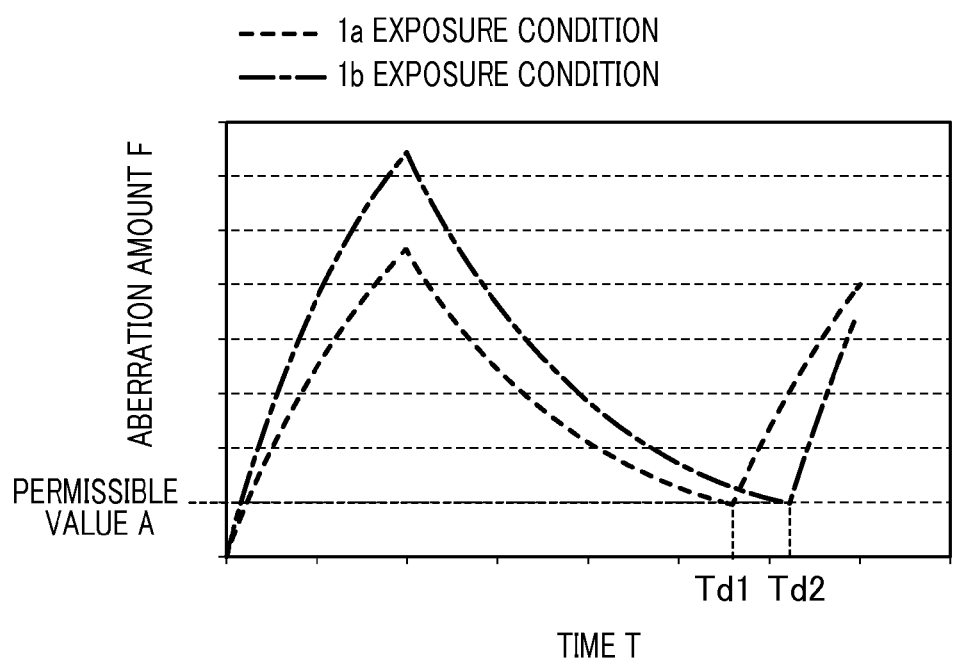
FIG. 5 is a graph illustrating simultaneous prediction of aberration fluctuation under a plurality of exposure conditions.

When a plurality of aberrations is independently and simultaneously evaluated, the main controller 20 may execute the same determination for each of the plurality of aberrations in step S103 with reference to the flowchart shown in FIG. 3. FIG. 5 is a graph illustrating the prediction of aberration fluctuation in this case. As in FIG. 4, a time T is plotted on the horizontal axis and an aberration amount F of a certain image height of the projection optical system 7 is plotted on the vertical axis. The broken line shown in FIG. 5 indicates the predicted amount from the aberration fluctuation coefficient relating to the 1a exposure condition and indicates that, when the predicted amount F(T) is less than the permissible value A, the non-exposure model immediately ends and the prediction under the second exposure condition starts. Time T when the predicted amount F(T) is less than the permissible value A is Td1. On the other hand, the single-dotted chain line shown in FIG. 5 indicates the predicted amount from the aberration fluctuation coefficient relating to the 1b exposure condition and indicates that, when the predicted amount F(T) is less than the permissible value A, the non-exposure model immediately ends and the prediction under the second exposure condition starts. Time T when the predicted amount F(T) is less than the permissible value A is Td2.

Furthermore, a description has been given of the prediction of aberration fluctuation, the exposure apparatus 1 actually corrects the fluctuation amount of aberration based on the prediction. The correction method (or a correction mechanism for performing the correction method) depends on the type of aberration taut the present invention is not particularly limited. In some examples, when the projection optical system 7 is provided with a drive mechanism that precisely drives a lens (optical element) constituting the projection optical system 7 in a desired direction, aberration which occurs asymmetrically with respect to the optical axis can be corrected by the drive mechanism. In addition, aberration correction is performed in parallel with control of the drive amount of the stage 8, so that an alignment error of an image associated with the eccentricity of the lens provided in the projection optical system 7 can be reduced. Furthermore, when focus correction is performed, not only the projection optical system 7 but also the reticle stage 6 or the stage 8 are driven in the Z-axis direction or in the tilt direction, so that their positions and postures can be corrected.

(Device Manufacturing Method)

Next, a description will be given of a method for manufacturing a device (semiconductor device, liquid crystal display device, or the like) according to one embodiment of the present invention. The semiconductor device is manufactured by a front-end process in which an integrated circuit is formed on a wafer and a back-end process in which an integrated circuit chip is completed as a product from the integrated circuit on the wafer formed in the front-end process. The front-end process includes a step of exposing a wafer coated with a photosensitizer using the above-described exposure apparatus and a step of developing the exposed wafer. The back-end process includes an assembly step (dicing and bonding) and a packaging step (sealing). The liquid crystal display device is manufactured by a process in which a transparent electrode is formed. The process of forming a transparent electrode includes a step of applying a photosensitizer to a glass substrate on which a transparent conductive film is deposited, a step of exposing the glass substrate coated with the photosensitizer using the above-described exposure apparatus, and a step of developing the exposed glass substrate. According to the device manufacturing method of the present embodiment, a device having a higher quality than that of the conventional device may be manufactured.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-011074 filed on Jan. 24, 2013, which is hereby incorporated by reference herein in its entirety.

What is claimed is:

1. An exposure method of exposing a pattern formed on an original onto a substrate via a projection optical system, the method comprising the steps of:
   setting a first exposure condition for obtaining a first coefficient for predicting a fluctuation in an imaging characteristic of the projection optical system under the first exposure condition;
   determining the first coefficient and a permissible value calculated from aberration measurement reproducibility based on a fluctuation characteristic model;
   calculating a predicted amount of the fluctuation in the imaging characteristic under the first exposure condition based on the first coefficient;
   determining whether or not the predicted amount of the fluctuation is less than the permissible value for each time instant;
   obtaining a second coefficient for predicting the fluctuation in the imaging characteristic of the projection optical system under a second exposure condition at the time at which the predicted amount of the fluctuation is determined to be less than the permissible value;
   calculating the predicted amount of the fluctuation in the imaging characteristic under the second exposure condition based on the second coefficient; and
   exposing the pattern formed on the original onto the substrate based on the first exposure condition corrected based on the first coefficient or the second exposure condition corrected based on the second coefficient,
   wherein the permissible value satisfies the following condition:

$$A = C \times (1/f),$$

where A represents the permissible value, f represents the aberration measurement reproducibility, and C represents a constant.

2. The exposure method according to claim 1, wherein, when a plurality of aberrations is independently and simultaneously evaluated under the first exposure condition, whether or not the predicted amount is less than the permissible value is determined for each of the plurality of aberrations.

3. The exposure method according to claim 1, wherein the fluctuation characteristic model includes an exposure model indicating aberration fluctuation during irradiation of the projection optical system with exposure light and a non-exposure model indicating aberration fluctuation in a state in which irradiation is stopped.

4. An exposure method of exposing a pattern formed on an original onto a substrate via a projection optical system, the method comprising the steps of:
   setting a first exposure condition for obtaining a first coefficient for predicting a fluctuation in an imaging characteristic of the projection optical system under the first exposure condition;
   determining the first coefficient and a permissible value calculated from aberration measurement reproducibility based on a fluctuation characteristic model;
   calculating a predicted amount of the fluctuation in the imaging characteristic under the first exposure condition based on the first coefficient;
   determining whether or not the predicted amount of the fluctuation is less than the permissible value for each time instant;
   obtaining a second coefficient for predicting the fluctuation in the imaging characteristic of the projection optical system under a second exposure condition at the time at which the predicted amount of the fluctuation is determined to be less than the permissible value;
   calculating the predicted amount of the fluctuation in the imaging characteristic under the second exposure condition based on the second coefficient; and
   exposing the pattern formed on the original onto the substrate based on the first exposure condition corrected based on the first coefficient or the second exposure condition corrected based on the second coefficient,
   wherein the permissible value satisfies the following condition:

$$A = C' \times (F1/f),$$

where A represents the permissible value, f represents the aberration measurement reproducibility, C' represents a constant, and F1 represents a maximum aberration amount under the first exposure condition.

5. The exposure method according to claim 4, wherein the fluctuation characteristic model includes an exposure model indicating aberration fluctuation during irradiation of the projection optical system with exposure light and a non-exposure model indicating aberration fluctuation in a state in which irradiation is stopped.

6. The exposure method according to claim 4, wherein when a plurality of aberrations are independently and simultaneously evaluated under the first exposure condition, whether or not the predicted amount of the fluctuation is less than the permissible value is determined for each of the plurality of aberrations.

7. An exposure apparatus that exposes a pattern formed on an original onto a substrate via a projection optical system, the exposure apparatus comprising:
   an original holder configured to hold the original;
   a substrate holder configured to hold the substrate; and
   a controller that controls at least one positional orientation of the projection optical system, the original holder, and the substrate holder, and is configured to:
      set a first exposure condition for obtaining a first coefficient for predicting a fluctuation in an imaging characteristic of the projection optical system under the first exposure condition;
      determine the first coefficient and a permissible value calculated from aberration measurement reproducibility based on a fluctuation characteristic model;
      calculate a predicted amount of the fluctuation in the imaging characteristic under the first exposure condition based on the first coefficient;
      determine whether or not the predicted amount is less than the permissible value for each time instant;

obtain a second coefficient for predicting the fluctuation in the imaging characteristic of the projection optical system under a second exposure condition at the time at which the predicted amount of the fluctuation is determined to be less than the permissible value;

calculate the predicted amount of the fluctuation in the imaging characteristic under the second exposure condition; and expose the pattern formed on the original onto the substrate based on the first exposure condition corrected based on the first coefficient or the second exposure condition corrected based on the second coefficient, wherein the permissible value satisfies the following condition:

$$A = C \times (1/f),$$

where A represents the permissible value, f represents the aberration measurement reproducibility, and C represents a constant.

8. A device manufacturing method comprising the steps of:

exposing a substrate using an exposure method of exposing a pattern formed on an original onto a substrate via a projection optical system; and developing the exposed substrate, wherein the exposure method includes the steps of:

setting a first exposure condition for obtaining a first coefficient for predicting a fluctuation in an imaging characteristic of the projection optical system under the first exposure condition;

determining the first coefficient and a permissible value calculated from aberration measurement reproducibility based on a fluctuation characteristic model;

calculating a predicted amount of the fluctuation in the imaging characteristic under the first exposure condition based on the first coefficient;

determining whether or not the predicted amount is less than the permissible value for each time instant;

obtaining a second coefficient for predicting the fluctuation in the imaging characteristic of the projection optical system under a second exposure condition at the time at which the predicted amount of the fluctuation is determined to be less than the permissible value;

calculating the predicted amount of the fluctuation in the imaging characteristic under the second exposure condition based on the second coefficient; and exposing the pattern formed on the original onto the substrate based on the first exposure condition corrected based on the first coefficient or the second exposure condition corrected based on the second coefficient, wherein the permissible value satisfies the following condition:

$$A = C \times (1/f),$$

where A represents the permissible value, f represents the aberration measurement reproducibility, and C represents a constant.

9. An exposure apparatus for exposing a pattern formed on an original onto a substrate via a projection optical system, the exposure apparatus comprising:

an original holder configured to hold the original;

a substrate holder configured to hold the substrate; and a controller that controls at least one positional orientation of the projection optical system, the original holder, and the substrate holder, and configured to:

set a first exposure condition for obtaining a first coefficient for predicting a fluctuation in an imaging characteristic of the projection optical system under the first exposure condition;

determine the first coefficient and a permissible value calculated from aberration measurement reproducibility based on a fluctuation characteristic model;

calculate a predicted amount of the fluctuation in the imaging characteristic under the first exposure condition based on the first coefficient;

determine whether or not the predicted amount is less than the permissible value for each time instant;

obtain a second coefficient for predicting the fluctuation in the imaging characteristic of the projection optical system under a second exposure condition at the time at which the predicted amount of the fluctuation is determined to be less than the permissible value;

calculate a predicted amount of the fluctuation in the imaging characteristic under the second exposure condition based on the second coefficient; and expose the pattern formed on the original onto the substrate based on the first exposure condition corrected based on the first coefficient or the second exposure condition corrected based on the second coefficient, wherein the permissible value satisfies the following condition:

$$A = C' \times (F1/f),$$

where A represents the permissible value, f represents the aberration measurement reproducibility, C' represents a constant, and F1 represents a maximum aberration amount under the first exposure condition.

10. A device manufacturing method comprising the steps of:

exposing a substrate using an exposure method of exposing a pattern formed on an original onto a substrate via a projection optical system; and developing the exposed substrate, wherein the exposure method includes the steps of:

setting a first exposure condition for obtaining a first coefficient for predicting a fluctuation in an imaging characteristic of the projection optical system under the first exposure condition;

determining the first coefficient and a permissible value calculated from aberration measurement reproducibility based on a fluctuation characteristic model;

calculating a predicted amount of the fluctuation in the imaging characteristic under the first exposure condition based on the first coefficient;

determining whether or not the predicted amount is less than the permissible value for each time instant;

obtaining a second coefficient for predicting the fluctuation in the imaging characteristic of the projection optical system under a second exposure condition at the time at which the predicted amount of the fluctuation is determined to be less than the permissible value;

calculating the predicted amount of the fluctuation in the imaging characteristic under the second exposure condition based on the second coefficient; and exposing the pattern formed on the original onto the substrate based on the first exposure condition corrected based on the first coefficient or the second exposure condition corrected based on the second coefficient, wherein the permissible value satisfies the following condition:

$$A = C' \times (F1/f),$$

where A represents the permissible value, f represents the aberration measurement reproducibility, C' represents a constant, and F1 represents a maximum aberration amount under the first exposure condition.

11. A method of predicting fluctuation in an imaging characteristic of a projection optical system in an exposure apparatus for projecting a pattern formed on an original onto a substrate via the projection optical system, the method comprising the steps of:

setting a first exposure condition for obtaining a first coefficient for predicting a fluctuation in the imaging characteristic of the projection optical system under the first exposure condition;

determining the first coefficient and a permissible value based on a measurement result of the imaging characteristic of the projection optical system irradiated with exposure light under the first exposure condition, and a predicted amount of the fluctuation in the imaging characteristic based on a fluctuation characteristic model under the first exposure condition;

determining whether or not the predicted amount is less than the permissible value for each time instant;

obtaining a second coefficient for predicting the fluctuation in the imaging characteristic of the projection optical system under a second exposure condition at the time at which the predicted amount of the fluctuation is determined to be less than the permissible value; and calculating the predicted amount of the fluctuation in the imaging characteristic under the second exposure condition based on the second coefficient, wherein the permissible value satisfies the following condition:

$$A = C \times (1/f),$$

where A represents the permissible value, f represents the aberration measurement reproducibility, and C represents a constant.

12. A method of predicting fluctuation in an imaging characteristic of a projection optical system in an exposure apparatus for projecting a pattern formed on an original onto a substrate via the projection optical system, the method comprising the steps of:

setting a first exposure condition for obtaining a first coefficient for predicting a fluctuation in the imaging characteristic of the projection optical system under the first exposure condition;

determining the first coefficient and a permissible value based on a measurement result of the imaging characteristic of the projection optical system irradiated with exposure light under the first exposure condition, and a predicted amount of the fluctuation in the imaging characteristic based on a fluctuation characteristic model under the first exposure condition;

determining whether or not the predicted amount is less than the permissible value for each time instant;

obtaining a second coefficient for predicting the fluctuation in the imaging characteristic of the projection optical system under a second exposure condition at the time at which the predicted amount of the fluctuation is determined to be less than the permissible value; and calculating the predicted amount of the fluctuation in the imaging characteristic under the second exposure condition based on the second coefficient, wherein the permissible value satisfies the following condition:

$$A = C' \times (F1/f),$$

where A represents the permissible value, f represents the aberration measurement reproducibility, C' represents a constant, and F1 represents a maximum aberration amount under the first exposure condition.

* * * * *